(12) United States Patent
Li

(10) Patent No.: US 8,507,924 B2
(45) Date of Patent: Aug. 13, 2013

(54) LIGHT EMITTING DIODE WITH HIGH ASPECT RATIO SUBMICRON ROUGHNESS FOR LIGHT EXTRACTION AND METHODS OF FORMING

(75) Inventor: Ting Li, Ventura, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/045,246

(22) Filed: Mar. 10, 2011

(65) Prior Publication Data

US 2011/0169030 A1    Jul. 14, 2011

Related U.S. Application Data

(60) Division of application No. 11/498,418, filed on Aug. 2, 2006, now Pat. No. 7,932,106, which is a continuation-in-part of application No. 11/083,460, filed on Mar. 17, 2005, now Pat. No. 7,534,633.

(60) Provisional application No. 60/585,326, filed on Jul. 2, 2004.

(51) Int. Cl.
*H01L 27/15*    (2006.01)
(52) U.S. Cl.
USPC ..... 257/79; 257/98; 257/E33.067; 257/E33.068; 257/E33.074
(58) Field of Classification Search
USPC ........ 257/79, 98, E33.067, E33.068, E33.074
See application file for complete search history.

(56) References Cited

U.S. PATENT DOCUMENTS

| | | |
|---|---|---|
| 3,896,479 A | 7/1975 | Di Lorenzo et al. |
| 4,152,044 A | 5/1979 | Liu |
| 4,675,575 A | 6/1987 | Smith et al. |
| 4,914,489 A | 4/1990 | Awano ............................ 257/6 |
| 4,946,547 A | 8/1990 | Palmour et al. |
| 4,963,948 A | 10/1990 | Awano ......................... 257/183 |
| 5,034,783 A | 7/1991 | Chang et al. .................. 257/192 |
| 5,200,022 A | 4/1993 | Kong et al. |

(Continued)

FOREIGN PATENT DOCUMENTS

| | | |
|---|---|---|
| EP | 1063711 A1 | 12/1920 |
| EP | 0 272 985 A2 | 6/1988 |

(Continued)

OTHER PUBLICATIONS

Office Action from U.S. Appl. No. 11/982,275, dated: Aug. 20, 2010.

(Continued)

*Primary Examiner* — Andy Huynh
(74) *Attorney, Agent, or Firm* — Koppel, Patrick, Heybl & Philpott

(57) ABSTRACT

The surface morphology of an LED light emitting surface is changed by applying a reactive ion etch (RIE) process to the light emitting surface. High aspect ratio, submicron roughness is formed on the light emitting surface by transferring a thin film metal hard-mask having submicron patterns to the surface prior to applying a reactive ion etch process. The submicron patterns in the metal hard-mask can be formed using a low cost, commercially available nano-patterned template which is transferred to the surface with the mask. After subsequently binding the mask to the surface, the template is removed and the RIE process is applied for time duration sufficient to change the morphology of the surface. The modified surface contains non-symmetric, submicron structures having high aspect ratio which increase the efficiency of the device.

15 Claims, 3 Drawing Sheets

(56) References Cited

U.S. PATENT DOCUMENTS

| | | | |
|---|---|---|---|
| RE34,861 E | 2/1995 | Davis et al. | |
| 5,477,436 A | 12/1995 | Bertling et al. | |
| 5,612,567 A | 3/1997 | Baliga | |
| 5,628,917 A | 5/1997 | MacDonald et al. | 216/2 |
| 5,705,321 A * | 1/1998 | Brueck et al. | 430/316 |
| 6,046,464 A | 4/2000 | Schetzima | |
| 6,063,699 A * | 5/2000 | Hanafi et al. | 438/589 |
| 6,150,672 A | 11/2000 | Kaneko | 257/94 |
| 6,330,111 B1 | 12/2001 | Myers | |
| 6,331,915 B1 | 12/2001 | Myers | |
| 6,331,944 B1 | 12/2001 | Monsma et al. | 365/171 |
| 6,389,051 B1 | 5/2002 | Van de Walle et al. | 372/45.01 |
| 6,410,942 B1 | 6/2002 | Thibeault et al. | |
| 6,482,711 B1 | 11/2002 | Nguyen et al. | 438/317 |
| 6,504,179 B1 | 1/2003 | Ellens et al. | 257/88 |
| 6,526,082 B1 | 2/2003 | Corzine et al. | 372/46.01 |
| 6,657,236 B1 | 12/2003 | Thibeault et al. | |
| 6,657,393 B2 | 12/2003 | Natsume | |
| 6,693,357 B1 * | 2/2004 | Borst et al. | 257/773 |
| 6,746,889 B1 | 6/2004 | Eliashevich et al. | |
| 6,784,463 B2 | 8/2004 | Camras et al. | |
| 6,878,634 B2 | 4/2005 | Imada et al. | 438/700 |
| 6,878,975 B2 | 4/2005 | Hueschen | 257/104 |
| 6,882,051 B2 | 4/2005 | Majumdar et al. | 257/746 |
| 6,884,647 B2 | 4/2005 | Sakai et al. | 438/30 |
| 6,932,497 B1 | 8/2005 | Huang | |
| 6,949,774 B2 | 9/2005 | Parikh et al. | 257/104 |
| 7,083,490 B2 | 8/2006 | Mueller et al. | 445/24 |
| 7,087,936 B2 | 8/2006 | Negley | |
| 7,194,170 B2 | 3/2007 | Biegelsen | 385/116 |
| 7,214,626 B2 | 5/2007 | Huang | 438/734 |
| 7,374,968 B2 | 5/2008 | Kornilovich et al. | 438/110 |
| 7,491,626 B2 | 2/2009 | Gaska et al. | 438/483 |
| 7,662,544 B2 * | 2/2010 | Pawlowski et al. | 430/321 |
| 2002/0015013 A1 | 2/2002 | Ragle | |
| 2002/0054495 A1 | 5/2002 | Natsume | |
| 2003/0015708 A1 | 1/2003 | Parikh | |
| 2003/0020069 A1 | 1/2003 | Holmes et al. | |
| 2003/0085409 A1 | 5/2003 | Shen | |
| 2003/0165169 A1 | 9/2003 | Nomoto et al. | |
| 2003/0218183 A1 | 11/2003 | Micovic et al. | 257/192 |
| 2004/0206966 A1 | 10/2004 | Sugawara et al. | 257/85 |
| 2004/0207313 A1 | 10/2004 | Omoto et al. | |
| 2005/0077535 A1 | 4/2005 | Li | |
| 2005/0117320 A1 | 6/2005 | Leu et al. | 362/31 |
| 2005/0152127 A1 | 7/2005 | Kamiya et al. | |
| 2005/0158637 A1 | 7/2005 | Kim et al. | |
| 2005/0173692 A1 | 8/2005 | Park | |
| 2005/0173728 A1 | 8/2005 | Saxler | |
| 2005/0219668 A1 | 10/2005 | Taghizadeh | |
| 2005/0224829 A1 | 10/2005 | Negley et al. | 257/99 |
| 2006/0034576 A1 | 2/2006 | Merritt et al. | |
| 2006/0081862 A1 | 4/2006 | Chua et al. | |
| 2006/0113638 A1 * | 6/2006 | Maaskant et al. | 257/623 |
| 2006/0158899 A1 | 7/2006 | Avabe et al. | |
| 2006/0220046 A1 | 10/2006 | Yu et al. | 257/98 |
| 2006/0267031 A1 | 11/2006 | Tasch et al. | |
| 2007/0007558 A1 | 1/2007 | Mazzochette | 257/239 |
| 2007/0025231 A1 | 2/2007 | Ochiai | |
| 2007/0041101 A1 | 2/2007 | Goosey et al. | 259/676 |
| 2007/0090383 A1 | 4/2007 | Ota et al. | |
| 2007/0164487 A1 | 7/2007 | Beck et al. | |
| 2007/0268694 A1 | 11/2007 | Bailey et al. | 362/231 |
| 2008/0036364 A1 | 2/2008 | Li et al. | |
| 2008/0074032 A1 | 3/2008 | Yano et al. | |
| 2011/0193057 A1 | 8/2011 | Sabathil et al. | |

FOREIGN PATENT DOCUMENTS

| | | |
|---|---|---|
| EP | 0881666 A2 | 2/1998 |
| EP | 0936682 A | 8/1999 |
| EP | 1189289 A1 | 3/2002 |
| EP | 1313187 A1 | 5/2003 |
| EP | 1349202 A | 10/2003 |
| EP | 1653255 | 5/2006 |
| EP | 1681509 | 7/2006 |
| EP | 2048718 | 4/2009 |
| FR | 2586844 | 3/1987 |
| FR | 2759188 | 8/1998 |
| FR | 2814220 | 3/2002 |
| JP | 11330552 | 11/1966 |
| JP | S63-288061 | 11/1988 |
| JP | H05-075101 | 3/1993 |
| JP | H05-283672 | 10/1993 |
| JP | 6268257 A | 9/1994 |
| JP | 7162038 A | 6/1995 |
| JP | 7176826 A | 7/1995 |
| JP | 8023124 A | 1/1996 |
| JP | 8070139 A | 3/1996 |
| JP | 8162671 A | 6/1996 |
| JP | 8274414 A | 10/1996 |
| JP | 9330630 A | 12/1996 |
| JP | 9148678 A | 6/1997 |
| JP | 9153642 A | 6/1997 |
| JP | 9162444 A | 6/1997 |
| JP | 11040850 | 7/1997 |
| JP | 9219556 A | 8/1997 |
| JP | 10012969 A | 1/1998 |
| JP | 10041581 A | 2/1998 |
| JP | 10065271 | 3/1998 |
| JP | 10145000 A | 5/1998 |
| JP | 10145002 A | 5/1998 |
| JP | 10033557 A | 12/1998 |
| JP | 11074562 A | 3/1999 |
| JP | 11186659 A | 7/1999 |
| JP | 11191638 A | 7/1999 |
| JP | 11224972 A | 8/1999 |
| JP | 11238945 A | 8/1999 |
| JP | 11251684 A | 9/1999 |
| JP | 11298090 A | 10/1999 |
| JP | 2000-049363 | 2/2000 |
| JP | 2000068594 A | 3/2000 |
| JP | 2000-150920 | 5/2000 |
| JP | 2000133883 A | 5/2000 |
| JP | 2000150956 A | 5/2000 |
| JP | 2000244072 A | 9/2000 |
| JP | 2000307149 A | 11/2000 |
| JP | 2001168471 | 6/2001 |
| JP | 2001332770 A | 11/2001 |
| JP | 2002543594 | 12/2002 |
| JP | 2002543594 A | 12/2002 |
| JP | 2003-59938 | 2/2003 |
| JP | 2003-152219 | 5/2003 |
| JP | 2003258313 A | 9/2003 |
| JP | 2003318449 A | 11/2003 |
| JP | 2005228833 | 8/2005 |
| JP | 2007-036010 | 2/2007 |
| JP | 2007-189239 | 7/2007 |
| JP | 2007189239 | 7/2007 |
| JP | 2009094517 | 4/2009 |
| WO | WO 9831055 A1 | 7/1998 |
| WO | WO 98/37585 A1 | 8/1998 |
| WO | WO 9856043 | 12/1998 |
| WO | WO 9905728 A1 | 2/1999 |
| WO | WO 9946822 A1 | 9/1999 |
| WO | WO 0021143 | 4/2000 |
| WO | WO 0076004 A1 | 12/2000 |
| WO | WO 01-41224 | 6/2001 |
| WO | WO 02-01608 | 1/2002 |
| WO | WO 0205399 A1 | 1/2002 |
| WO | WO 02/11212 A1 | 2/2002 |
| WO | WO 0211212 A | 2/2002 |
| WO | 03044870 | 5/2003 |
| WO | WO03080763 A1 | 10/2003 |
| WO | WO2004084316 | 9/2004 |
| WO | WO2004084316 A2 | 9/2004 |
| WO | WO2004109813 | 12/2004 |
| WO | WO2004109813 A2 | 12/2004 |
| WO | WO 2005/098976 A | 10/2005 |
| WO | WO2005098976 A2 | 10/2005 |
| WO | WO 2005104247 | 11/2005 |
| WO | WO 2007005844 A | 1/2007 |
| WO | WO2007075815 | 7/2007 |
| WO | WO 2008 020913 | 2/2008 |
| WO | WO2008020913 | 2/2008 |

OTHER PUBLICATIONS

Response to Office Action from U.S. Appl. No. 11/982,275, filed Nov. 9, 2010.
Office Action from U.S. Appl. No. 11/173,035, dated: Oct. 6, 2010.
Examiners interview in response to Office Action from U.S. Appl. No. 11/173,035 dated:Feb. 16, 2011.
Office Action from U.S. Appl. No. 11/900,952, dated: Feb. 26, 2010.
Response to Office Action from U.S. Appl. No. 11/900,952, filed May 26, 2010.
Office Action from U.S. Appl. No. 11/974,431, dated: Apr. 14, 2010.
Response to Office Action from U.S. Appl. No. 11/974,431, filed Jul. 6, 2010.
Office Action from U.S. Appl. No. 11/173,035, dated: Apr. 1, 2010.
Response to Office Action from U.S. Appl. No. 11/173,035, filed Jun. 1, 2010.
Office Action from U.S. Appl. No. 12/151,089, dated May 11, 2010.
Response to Office Action from U.S. Appl. No. 12/151,089, filed Oct. 11, 2010.
Office Action from U.S. Appl. No. 11/982,275, dated Jan. 13, 2011.
Office Action from U.S. Appl. No. 11/974,431, dated Feb. 16, 2011.
Office Action from U.S. Appl. No. 11/974,431, dated: Sep. 22, 2010.
Response to Office Action from U.S. Appl. No. 11/974,431, filed Nov. 9, 2010.
Office Action from U.S. Appl. No. 11/818,818, dated: May 11, 2010.
Response to Office Action from U.S. Appl. No. 11/818,818, filed Oct. 19, 2010.
Office Action from U.S. Appl. No. 11/900,952, dated: Jul. 23, 2010.
Response to Office Action from U.S. Appl. No. 11/900,952, filed Dec. 22, 2010.
Notice of Allowance for U.S. Appl. No. 11/498,418, mailed Dec. 23, 2010.
Office Action for U.S. Appl. No. 11/498,418, mailed Sep. 15, 2010.
Response to Office Action U.S. Appl. No. 11/498,418, filed Dec. 13, 2010.
Office Action for U.S. Appl. No. 11/498,418, mailed May 4, 2010.
Response to Office Action U.S. Appl. No. 11/498,418, filed Aug. 2, 2010.
Office Action for U.S. Appl. No. 11/498,418, mailed Dec. 16, 2009.
Response to Office Action U.S. Appl. No. 11/498,418, filed Apr. 16, 2010.
Office Action for U.S. Appl. No. 11/498,418, mailed Apr. 29, 2009.
Response to Office Action U.S. Appl. No. 11/498,418, filed Aug. 31, 2009.
Extended European Search Report for Application No. 08253301.9-2222, dated: Feb. 24, 2009.
Extended European Search Report for Application No. 08160129.6-2222, dated: Dec. 15, 2008.
U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/939,052, filed Nov. 13, 2007.
U.S. Appl. No. 11/736,799, filed Apr. 18, 2007.
U.S. Appl. No. 11/877,038, filed Oct. 23, 2007.
U.S. Appl. No. 11/870,679, filed Oct. 11, 2007.
U.S. Appl. No. 11/948,041, filed Nov. 30, 2007.
U.S. Appl. No. 11/949,222, filed Dec. 3, 2007.
U.S. Appl. No. 12/174,053, filed Jul. 16, 2008.
U.S. Appl. No. 12/002,429, filed Dec. 4, 2007.
U.S. Appl. No. 12/045,729, filed Mar. 11, 2008.
U.S. Appl. No. 11/818,818, filed Jun. 14, 2007.
Notification of National Application Upon the Preliminary Examination of Patent Application from Chinese Patent Application No. 200880100370.5 dated Jun. 1, 2010.
Notification on Publication and Entry into Procedure of Substantive Examination of Invention Patent Application from Chinese Patent Application No. 200880100370.5 dated Aug. 18, 2010.
Canadian Patent Application No. 2,454,310 Office Action Dated: Feb. 9, 2010.
European Search Report from related European Application No. 07254498.4, received on Feb. 11, 2010.
Office Action from related Application No. 11/600,617, dated: Dec. 22, 2009.
Official Communication from the EPO regarding related European Application 08253301.9, dated: Nov. 17, 2009.
PCT Search Report and Written Opinion PCT/US2007/086237, date: May 8, 2008 in related application.
PCT Search Report and Written Opinion PCT/US2007/12403, Date: Aug. 6, 2008.
PCT Search Report and Written Opinion PCT/US2007/086242, Date: Mar. 4, 2008.
Asbeck et al."Enhancement of Base Conductivity Via the Piezoelectric Effect in AlGaN/GaN HBTs", Solid State Electronics, Elsevier Science Pub. Barking GB, vol. 44, No. 2, Feb. 1, 2000 pp. 211-219, XP004186190.
Johnson et al."New UV Light Emitter Based on AlGaN Heterostructures with Graded Electron and Hole Injectors", Materials Research Society Symposium-Proceedings 2002 Materials Research Society US, vol. 743, 2002, pp. 481-486.
Simon et al. "Polarization-Induced 3-Dimensional Electron Slabs in Graded AlGaN Layers", Materials Research Society Symposium Proceedings 2006 Materials Research Society US, vol. 892, Nov. 28, 2005, pp. 417-422.
Official Notice of Final Decision of Rejection re related Japanese Patent Appl. No. 2003-529535, Dated: Jan. 6, 2009.
European Communication from related European Appl. 02 798 906.0-1235, Dated Feb. 6, 2009.
Copending U.S. Appl. No. 11/443,741, date: Jun. 14, 2007.
Copending U.S. Appl. No. 11/685,761, date: Mar. 13, 2007.
Copending U.S. Appl. No. 11/939,059, date: Nov. 13, 2007.
Second Office Action from related Chinese Application No. 200710142217.6, dated: Nov. 6, 2009.
Office Action from related U.S. Appl. No. 11/600,617, dated: Dec. 22, 2009.
Notice Requesting Submission of Opinion re related Korean Application No. 10-2004-7001033, dated: Mar. 9, 2009.
Sakai et al., "Experimental Investigation of Dependence of Electrical Characteristics on Device Parameters in Trench MOS Barrier Shottky Diodes", Proceedings of 1998 International Symposium on Power Semiconductor Devices & ICs, Kyoto, pp. 293-296, Jun. 1998.
Zhang AP et al, "Comparison of Gan P-I-N and Schottky Rectifier Performance" IEEE Transactions on Electron Devices, IEEE Inc. New York, US, vol. 48, No. 3, pp. 407-411, Mar. 2001.
European Search Report, Feb. 24, 2009, re related European Application No. EP 08253301.
Notice of First Office Action from related China Patent Application No. 200710142217.6, dated: Jun. 22, 2009.
International Search Report for PCT/US2008/004453, Date: Sep. 9, 2008.
Written Opinion for PCT/US2008/004453, Date: Sep. 9, 2008.
Kim J K et al. "Strongly Enhanced Phosphor Efficiency in GaInN White Light-Emitting Diodes Using Remote Phosphor Configuration and Diffuse Reflector Cup", Japanese Journal of Applied Physics, Japan Society of Applied Physics, Tokyo, JP, vol. 44, No. 20-23, January 1, 2005, XP-001236966.
Invitation to Submit Applicant's Opinion (Summary) from Japanese Patent Application No. 2003-529535, Appeal Filing No. 2009-007421 dated Dec. 7, 2010.
Examiner's Report to the Board (Summary) from Japanese Patent Application No. 2003-529535, Appeal Filing No. 2009-007421 dated Dec. 7, 2010.
Notice of Reasons for Rejection for Japanese Patent Application No. JP 2007-143451 dated May 10, 2011.

Extended Search Report for European Patent Application No. 11154411.0 dated May 30, 2011.
Singh Madhusudan, et al., "Examination of Tunnel Junctions in the AlGaN/GaN System: Consequences of Polarization Charge", Applied Physics Letters, AIP, American Institute of Physics, Melville, NY, vol. 77, No. 12, Sep. 18, 2000, pp. 1867-1969.
Panda A.K. et al., "DC and High-Frequency Characteristics of GaN Based Impatts", IEEE Transactions on Electron Devices, IEEE Service Center, Pisacataway, NJ, US vol. 48, No. 4, Apr. 1, 2001, pp. 820-823.
Hsu, et al "Using NI Masks in Inductively Coupled Plasma Etching of High Density Hole in Patterns in GaN", Journal of Vacuum Science & Technology, B 23(4), Jul./Aug. 2005, pp. 1611-1614.
Wang, et al "High Optical Quality GaN Nanopillar Arrays", Applied Physics Letters, vol. 86, 071917 (2005).
Windisch, et al "Impact of Texture-Enhanced Transmission on High-Effieciency Surface-Textured Light-Emitting Diodes", Appl. Phys. Lett., vol. 79, No. 15, Oct. 2001, pp. 2315-2317.
Schnitzer, et al "30% External Quantum Efficiency From Surface Textured, Thin-Film Light-Emitting Diodes", Appl. Phsy. Lett., vol. 64, No. 16, Oct. 1993, pp. 2174-2176.
Windisch, et al "Light Extraction Mechanisums in High-Efficiency Surface Textured Light Emitting Diodes", IEEE Journal on Selected Topics in Quantum Electronics, vol. 8, No. 2, Mar./Apr. 2002, pp. 248-255.
Streubel et al, "High Brightness AlGaInP Light-Emitting Diodes", IEEE Journal on Selected Topics in Quantum Electronics, vol. 8, No. Mar./Apr. 2002, pp. 321-332.
Office Action from U.S. Appl. No. 11/900,952, Dated: May 26, 2011.
"The American Heritage Dictionary", Library of Congress, New College Ed., 1976, pp. 867.
"Properties of Delta Doped A10.25Ga0.75N and GaN Epitaxial Layers", Jeffrey S. Flynn, et al. Materials Research Society, 1 page.
"III-nitride ultraviolet light-emitting diodes with delta doping", K.H, Kim, et al, Applied Physics Letters, vol. 83. No. 3, Jul. 21, 2003, pp. 566-568.
Reduction of threading edge dislocation density in n-type GaN by Si delta-doping, Y.B. Pan, et al, Journal of Crystal Growth 286 (2006) 255-258.
Epitaxial Growth and Characterisation of Silicon Delta-Doped GaAs, AlAs and AlxGal-xAs, B. Sciana, et al, Crystal Res. Technol. 36 2001 8-10, pp. 1145-1154.
"Effects of periodic delta—doping on the properties of GaN:Si films grown on Si (111) substrates" L.S. Wang, et al, Applied Physics Letters, vol. 85, No. 34, Dec. 13, 2004, pp. 5881-5884.

"The effect of periodic silane burst on the properties of GaN on Si (111) substrates", Zang Keyan, et al, Singapore-MIT Alliance, E4-04-10 & Dept. of Materials Science and Engineering 4 pages.
European Search Report, EP 03 07 8515, dated: Feb. 2, 2004.
Partial European Search Report, EP 09 15 7557, dated: May 28, 2009.
Non-final Rejection, Korean Appl. No. 10-2003-7012710, dated: Aug. 8, 2008.
Non-final Rejection, Korean Appl. No. 10-2008-7026427, dated: Jan. 23, 2009.
Summary of Notice of Reasons for Rejection for Japanese Patent Application No. 2008-262602 mailed Jul. 12, 2011.
Office Action for Canadian Patent Application No. 2,454,310 dated Aug. 30, 2011.
Summary of Notice of Reasons for Rejection for Japanese Patent Application No. JP 2007-292302 dated Oct. 4, 2011.
Summary of Notice of Reasons for Rejection for Japanese Patent Application No. 2008-264568 mailed Nov. 15, 2011.
Summary of Notice of Reasons for Rejection for Japanese Patent Application No. 2008-182592 mailed Nov. 22, 2011.
M.A.L. Johnson, et al., New UV Light Emitter Based on AlGaN Heterostructures with Graded Electron and Hole Injectors, Mat. Res. Soc. Symp. Proc. vol. 743, 2003, pp. 481-486.
Simon, John, et al., Polarization-Induced 3-Dimension Electron Slabs in Graded AlGaN Layers, Material Res. Soc. Symp. vol. 892, 2006, pp. 417-422.
Summary of Notice of Reasons for Rejection for counterpart Japanese Patent Application No. JP 2007-292302 mailed Jan. 24, 2012.
Examination Report from European Patent Application No. 07254498.4 dated Jan. 1, 2012.
Summary of Decision of Rejection from Japanese Patent Application No. 2008-262602, dated May 8, 2012.
Notice of Reasons for Rejection for Japanese Patent Application No. 2007-143451, dated Jul. 31, 2012.
Examination of European Patent Application No. 08 253 301.9-2222, dated Apr. 24, 2012.
Decision for Grant for Japanese Patent Application No. 2008-182592, dated Jul. 3, 2012.
Decision of Rejection and Decision of Dismissal of Amendment from Japanese Patent Application No. 2007-143451, dated Nov. 13, 2012.
Appeal Board's Questioning from Japanese Patent Application No. 2008-262602, dated Dec. 14. 2012.

* cited by examiner

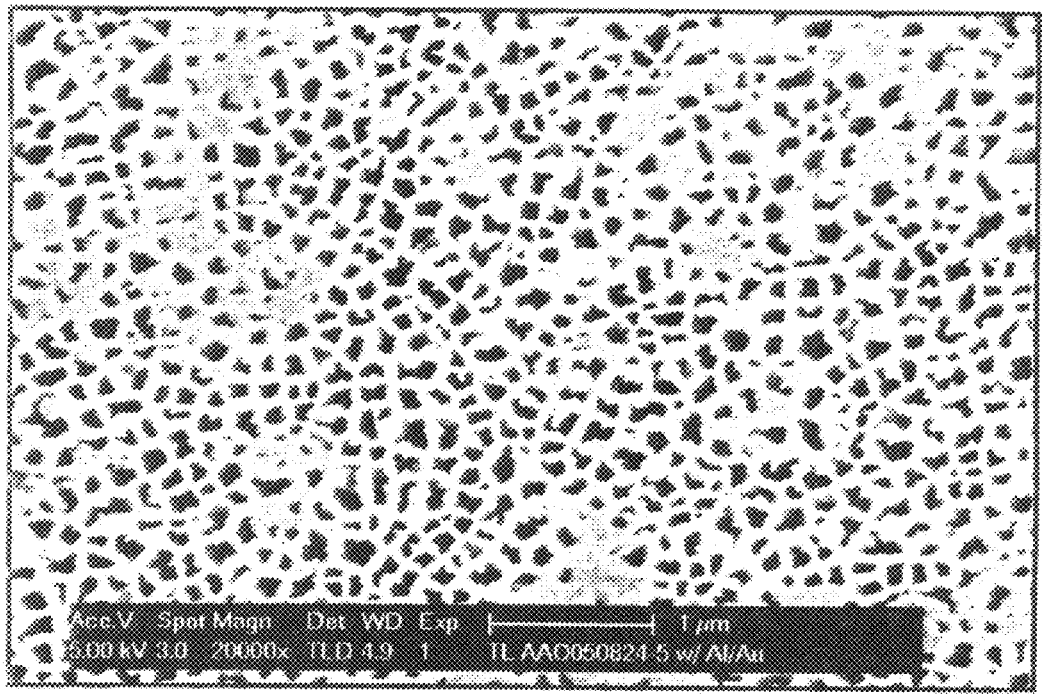
FIG. 3
FIG. 4
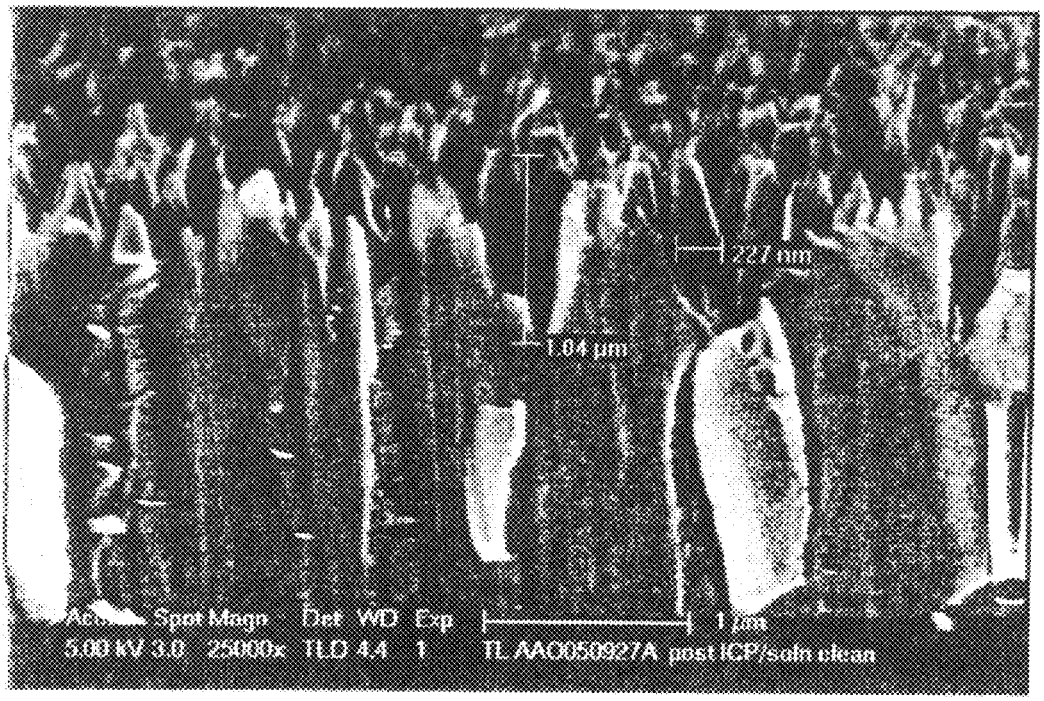

LIGHT EMITTING DIODE WITH HIGH ASPECT RATIO SUBMICRON ROUGHNESS FOR LIGHT EXTRACTION AND METHODS OF FORMING

This application is a divisional application of, and claims the benefit of, U.S. patent application Ser. No. 11/498,418, filed on Aug. 2, 2006 now U.S. Pat. No. 7,932,106, which is a continuation-in-part from, and claims the benefit of, U.S. patent application Ser. No. 11/083,460 filed Mar. 17, 2005, now U.S. Pat. No. 7,534,633, which claims the benefit of U.S. Provisional Patent Application Ser. No. 60/585,326, filed on Jul. 2, 2004.

This invention was made with Government support under Grant No. DE-FC26-03NT41943 awarded by the Department of Energy. The federal government may have certain rights in the invention.

BACKGROUND OF THE INVENTION

1. Field of the Invention

This invention relates to light emitting diodes (LEDs) and more particularly to new surface morphologies for enhancing the extraction of light from LEDs and methods of manufacturing LEDs having such surfaces.

2. Description of Related Art

Light emitting diodes (LEDs) are an important class of solid state devices that convert electric energy to light and generally comprise an active layer of semiconductor material sandwiched between two oppositely doped layers. When a bias is applied across the doped layers, holes and electrons are injected into the active layer where they recombine to generate light. Light is emitted omnidirectionally from the active layer and from all surfaces of the LED.

There has been a great deal of recent interest in LEDs formed of Group-III nitride based material systems because of their unique combination of material characteristics including high breakdown fields, wide bandgaps (3.36 eV for gallium nitride (GaN) at room temperature), large conduction band offset, and high saturated electron drift velocity. The doped and active layers are typically formed on a substrate that can be made of different materials such as silicon (Si), silicon carbide (SiC), and sapphire ($Al_2O_3$). SiC wafers are often preferred because they have a much closer crystal lattice match to Group-III nitrides, which results in Group III nitride films of higher quality. SiC also has a very high thermal conductivity so that the total output power of Group III nitride devices on SiC is not limited by the thermal resistance of the wafer (as is the case with some devices formed on sapphire or Si). Also, the availability of semi-insulating SiC wafers provides the capacity for device isolation and reduced parasitic capacitance that make commercial devices possible. SiC substrates are optical elements formed in an array. The optical elements have many different shapes, such as hemispheres and pyramids, and may be located on the surface of, or within, various layers of the LED. The elements provide surfaces from which light refracts or scatters.

One of the more popular approaches developed to reduce TIR and improve overall light extraction is surface texturing. Surface texturing increases the light's escape probability by providing a scattering surface morphology that allows photons multiple opportunities to find an escape cone. Light that does not find an escape cone continues to experience TIR, and reflects off the textured surface at different angles until it finds an escape cone. The benefits of surface texturing have been discussed in several articles. [See Windisch et al., Impact of Texture-Enhanced Transmission on High-Efficiency Surface Textured Light Emitting Diodes, Appl. Phys. Lett., Vol. 79, No. 15, October 2001, Pgs. 2316-2317; Schnitzer et al. 30% External Quantum Efficiency From Surface Textured, Thin Film Light Emitting Diodes, Appl. Phys. Lett., Vol. 64, No. 16, October 1993, Pgs. 2174-2176; Windisch et al. Light Extraction Mechanisms in High-Efficiency Surface Textured Light Emitting Diodes, IEEE Journal on Selected Topics in Quantum Electronics, Vol. 8, No. 2, March/April 2002, Pgs. 248-255; Streubel et al., High Brightness AlGaNInP Light Emitting Diodes, IEEE Journal on Selected Topics in Quantum Electronics, Vol. 8, No. March/April 2002].

Nano-patterning techniques have been used to generate modified surfaces containing submicron structures, and thin film metal-hard masks generally show a superior available from Cree, Inc., of Durham, N.C. and methods for producing them are set forth in the scientific literature as well as in U.S. Pat. No. Re. 34,861; U.S. Pat. Nos. 4,946,547; and 5,200,022.

The efficient extraction of light from LEDs is a major concern in the fabrication of high efficiency LEDs. For conventional LEDs with a single out-coupling surface, the external quantum efficiency is limited by total internal reflection (TIR) of light from the LED's emission region that passes through the substrate. TIR can be caused by the large difference in the refractive index between the LED's semiconductor and surrounding ambient. LEDs with SiC substrates have relatively low light extraction efficiencies because the high index of refraction of SiC (approximately 2.7) compared to the index of refraction for the surrounding material, such as epoxy (approximately 1.5). This difference results in a small escape cone from which light rays from the active area can transmit from the SiC substrate into the epoxy and ultimately escape from the LED package.

Different approaches have been developed to reduce TIR and improve overall light extraction. U.S. Pat. No. 6,410,942 discloses an LED structure that includes an array of electrically interconnected micro LEDs formed between first and second spreading layers. When a bias is applied across the spreaders, the micro LEDs emit light. Light from each of the micro LEDs reaches a surface after traveling only a short distance, thereby reducing TIR. U.S. Pat. No. 6,657,236 discloses structures for enhancing light extraction in LEDs through the use of internal and external dry etch selectivity to nitrides and most other semiconductors. Pattern transfer to nickel (Ni) and the use of Ni or anodic aluminum oxide ($Al_2O_3$, "AAO") as a durable etch mask have been demonstrated. [See Hsu et al., Using Nickel Masks in Inductively Coupled Plasma Etching of High Density Hole patterns in GaN, Journal of Vacuum Science & Technology B: Microelectronics and Nanometer Structures, Volume 23, Issue 4, pp. 1611-1614 (2005); Wang et al., High Optical Quality GaN Nanopillar Arrays, Applied Physics Letters, Vol. 86, 071917 (2005))]. Template assisted approaches to generating nano-particle structures or arrays have also been shown. [See Sander et al., Nanoparticle Arrays on Surfaces Fabricated Using Anodic Alumina Films as Templates, Advanced Functional Materials, Volume 13, Issue 5, Pages 393-397 (2003)].

SUMMARY OF THE INVENTION

Briefly, and in general terms, the invention is directed to semiconductor devices such as light emitting diodes (LEDs) formed by processes that allow for the creation of textured surfaces and methods for forming the textured surfaces. The invention is particularly applicable to LEDs where these textured surfaces can provide enhanced light extraction.

One embodiment of a method of fabricating a light emitting diode having a modified light emitting surface comprises transferring a metal hard-mask having submicron patterns to the light emitting surface, wherein the mask is attached to a nano-patterned template and the submicron patterns were formed using the template. Removing the template from the mask and applying an etch process to at least one portion of the light emitting surface comprising the mask, wherein the process is applied for a time duration sufficient to change the morphology of the surface in the at least one portion of the surface covered by the mask.

Another method according to the present invention comprises fabricating a metal hard-mask comprising submicron patterns, comprising providing a nano-patterned template comprising at least one porous material, wherein the nano-pattern is an inherent property of the at least one material. Depositing a thin layer of metal on the template.

One embodiment of a semiconductor device according to the present invention comprises a plurality of semiconductor layers at least one of which has an exposed surface. At least a portion of the exposed surface having a high aspect ratio submicron roughness. The invention is particularly applicable to LEDs wherein the exposed surface is a light emitting surface, and the high aspect ratio surface roughness enhances light extraction.

These and other aspects and advantages of the invention will become apparent from the following detailed description and the accompanying drawings which illustrate by way of example the features of the invention.

BRIEF DESCRIPTION OF THE DRAWINGS

FIG. 3 is a scanning electron microscope image of the top side of a polished template showing an exemplary nano-pattern;

FIG. 4 is a scanning electron microscope image of a cross section taken through a textured light emitting surface layer showing the etch depth and high aspect ratio submicron roughness of the surface.

DETAILED DESCRIPTION OF THE INVENTION

Figure 1:
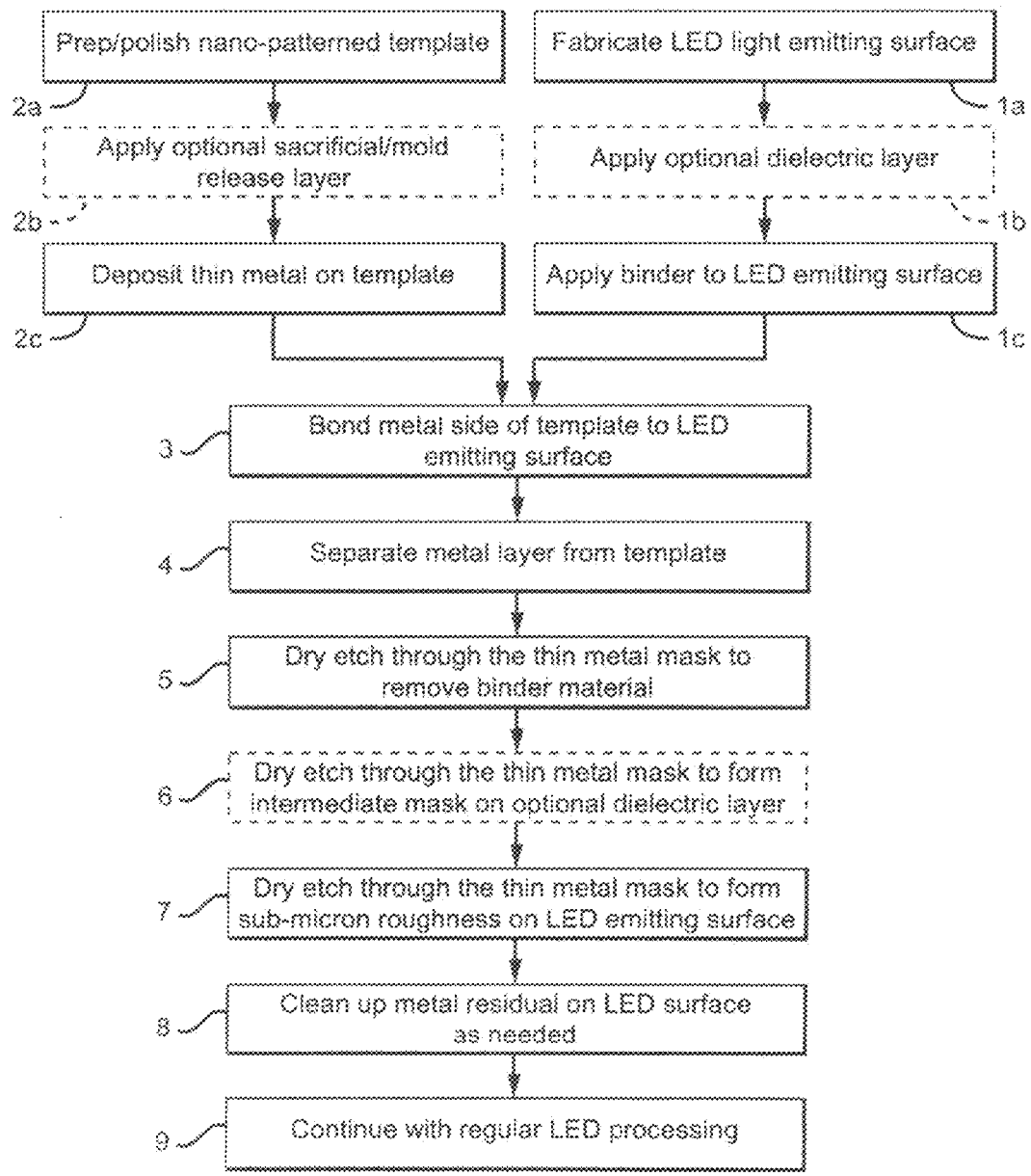
FIG. 1 is a flow chart of one embodiment of a method according to the present invention for fabricating a textured light emitting surface in an LED.

The present invention provides surface morphology to one or more surfaces of a semiconductor device and in particular to light emitting diodes to improve light extraction. A particular type of textured surface morphology is added to one or more surfaces of an LED. The surface morphology can be created in the surface through one or more additional steps in the LED fabrication process. The morphology of the textured surface allows light that would otherwise be trapped in the LED by total internal reflection (TIR) to escape from the device to enhance emission, thereby increasing the emission efficiency of the LED.

In general, the present invention uses a mask having submicron patterns for dry etch to achieve submicron roughness in a surface of the LED, with a preferred mask being a metal hard-mask. In particular, the metal hard-mask can be formed from a template having inherent submicron (nano-pattern) features and may be transferred to the light emitting surface while bound to the template containing the submicron (nano-pattern) features. The submicron roughness provided by this approach can have a deep etch depth (~1 μm) and non-symmetrical, multi-faceted projections on the external surface of LED chips, leading to improved light extraction.

In one embodiment according to the present invention a thin-film metal hard-mask is utilized having submicron features to fabricate a surface having high aspect ratio submicron roughness. This surface is preferably a surface through which LED light passes to contribute to overall LED emission, or emission of an emitter package utilizing the LED. The metal hard-mask can be transferred to the surface from a pre-defined template used to pattern the mask. The mask can be patterned using low-cost, commercially available templates, providing an inexpensive approach to achieve deep, submicron roughness on nitrides for light extraction, an approach that can potentially be used to fabricate any type of LED chip.

In one of several aspects, the invention relates to a method of fabricating an LED having a modified light emitting surface. The method includes transferring a template-bound metal hard-mask having submicron patterns to a light emitting surface of an LED, and applying a reactive ion etch (RIE) process to the masked surface for a time duration sufficient to change the morphology of the surface.

In another aspect, the invention relates to a cost-effective method for fabricating a metal hard-mask having submicron patterns. The method includes depositing a thin metal layer on a template containing an inherent nano-pattern. The template may contain a sacrificial or mold release layer to facilitate its removal in a subsequent processing step.

Other features and advantages of the invention will be apparent from the following detailed description when taken together with the drawings, and from the claims. The following description presents preferred embodiments of the invention representing the best mode contemplated for practicing the invention. This description is not to be taken in a limiting sense but is made merely for the purpose of describing the general principles of the invention whose scope is defined by the appended claims.

Before addressing details of embodiments described below, some terms are defined or clarified. As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

As used herein, the term "adjacent to" when referring to a layer or coating on a particular surface does not necessarily mean that the layer or coating is immediately next to the surface. There may or may not be another contiguous or non-contiguous layer, coating, or material present between the layer or coating described and the surface, and the surface itself can be another layer or coating.

As used herein, the phrase "high aspect ratio" when used to describe surface roughness is intended to mean that the average ratio of height to width for the structures on the surface is greater than about 2.

As used herein, the term "pitch" when referring a porous template or hard-mask structure is intended to mean the center-to-center distance between neighboring pores in the template or mask.

As used herein, the term "roughness" or "roughened" when referring to a surface is intended to mean the surface is marked by non-symmetrical surface structures, including without limitation irregular or multi-faceted projections containing inequalities, ridges, or multifaceted features, including without limitation numerous and random edges or angles.

As used herein, the phrase "submicron roughness" when referring to a roughened surface is intended to mean the dimensions of the structures on the surface are less than about one micron (1000 nm), including without limitation the height and width of the structures.

Attention is now directed to more specific details of embodiments that illustrate but not limit the invention.

FIG. 1 shows a flow chart of one embodiment of a method according to the present invention for forming the submicron roughness in the surface of a semiconductor material. In particular, the process steps in the method are adapted for forming high aspect ratio submicron roughness in a surface of an LED using an RIE process in the presence of a metal hard-mask according to one embodiment of the invention. A surface of an LED is fabricated (1a) using known semiconductor fabrication processes. In a preferred embodiment, the surface is preferably an emitting surface, i.e. a layer though which LED is designed to pass to contribute to emission. In one embodiment according to the present invention, the LED can be first fabricated on a suitable substrate, after which the substrate may be removed. One of the LED's emitting surfaces suitable for submicron roughness is the one exposed by the removal of the substrate, and is referred to as "back surface" or "backside" of the LED.

An optional dielectric layer may then be deposited on the back side of the light emitting surface (1b) (i.e. the surface of the light emitting layer from which the substrate was removed). In preparation for transferring a metal hard-mask to the back side of the light emitting surface, a suitable binder material can then be deposited on the dielectric layer (1c).

The metal hard-mask in this embodiment can be prepared by first prepping and polishing (e.g. smoothing) a suitable nano-patterned template (2a) such as a porous membrane. An optional sacrificial layer may then be applied to the polished top surface of the template (2b) to facilitate separation of the metal layer from the template in a later process step. Other types of release layers, including without limitation a mold release layer, could also be used for this purpose. A thin metal layer can then be deposited on the sacrificial layer (2c), forming a thin film metal hard-mask bearing essentially the same porous pattern as the template.

The metal hard-mask on the template can then be bonded to the light emitting surface (3), after which the template may be removed (4). The submicron roughness on the light emitting surface can then be formed by a series of dry etch steps through the thin metal film hard-mask to remove the binder material (5) and texture the surface (7). The optional dry etch step in this embodiment (6) generates an intermediate mask on, and ultimately removes, the dielectric layer (6). Any metal residual on the roughened surface may be subsequently removed by an additional step (8) such as wet etch, if necessary. The light emitting surface of the LED should then be ready for further processing (9).

The roughened light emitting surface generated by this method can have many different dimensions, with a suitable surface having submicron dimensions. Such dimensions include without limitation a deep etch depth of about 500 nm to 1000 nm and surface projections/structures having a high aspect ratio of about 5 to about 10 and an average diameter of about 100 nm to about 200 nm. The structures on the roughened surface should be high relative to the wavelength of light generated by the LED. Preferably, the height of the projections etched into the surface are at least about twice the wavelength of the light emitted by the LED, although other projection heights can also be used. The submicron projections can be rough and non-symmetrical, thereby increasing the number and type of edges or angles presented on the surface for enhancing light extraction.

During fabrication of the LED, the surface opposite the back side of the diode can be bonded to a carrier wafer before the substrate is removed from the back side of the diode. Suitable techniques for binding the top surface of the diode to a carrier wafer include without limitation a metal-based bonding process. A number of different processes can be used to remove the carrier wafer or substrate, including without limitation mechanical grinding, plasma etching, or combinations thereof. Many types of materials can be used as substrates or carrier wafer for the invention, including without limitation Si and SiC.

The template material can be chosen from a variety of materials depending on the type of nano-pattern desired, as long as the dimensions of the substructures within the template material are small relative to the wavelength of light within the device. In particular, a variety of commercially available filter membranes can be used as templates, including without limitation porous membranes composed of organic or inorganic polymers. The nano-pattern in such templates is based on their inherent porosity and no further patterning of the template should be required. Anodic aluminum oxide (AAO) is a non-limiting example of a suitable inorganic membrane that can be used as a template. Preferably, the pitch size of the template material ranges from about 100 nm to about 1 µm.

The optional sacrificial layer in the template may be composed of a variety of materials, including without limitation resist, polymer, and dielectrics such as silicon dioxide ($SiO_2$) or silicon nitride ($Si_3N_4$, "SiN"). Alternatively, a suitable optional mold release layer can be chosen from a variety of materials, including without limitation low surface energy polymers such as Teflon® AF, can be used.

The average diameter of the pores in the template may range from about 50 nm to about 500 nm and the average pitch size may range from about 1 to about 200 μm, depending upon the material chosen. Preferably, the average pitch size is about double the average pore size. Preparation of the template may require additional chemical or physical/mechanical process (prepping) steps in order to produce a smoothed top surface for optimal bonding including, without limitation, mechanical polishing or plasma etch.

The type of metal used for the metal hard-mask can vary according to the requirements of the process, including without limitation any noble metal such as platinum (Pt), palladium (Pd), aluminum (Al) gold (Au), or combination thereof. Metal deposition can be achieved by any number of known techniques, including without limitation electron beam evaporation, thermal evaporation, and sputtering. The thickness of the metal layer should be less than about 200 nm (2000 Å).

This method can be used to form submicron roughness in the surface of semiconductor materials in many different devices made of many different semiconductor materials. In one embodiment the light emitting surface can be in an LED made from a number of materials, including without limitation GaN and GaN on SiC ("GaN/SiC"). Additional layers for enhancing etch selectivity may also be present on the light emitting surface, including without limitation a dielectric layer. In one embodiment, a dielectric layer can be deposited onto the exposed light emitting surface prior to deposition of the binder material. The presence of the dielectric layer can enhance etch selectivity when a targeted etch depth is required in the light emitting surface. Dielectric materials useful for the invention include without limitation $SiO_2$ and SiN, although other materials can also be used. The thickness of the dielectric layer can vary, with a suitable thickness being less than approximately 1000 nm.

A variety of binder materials are suitable for the invention, including without limitation polymer resist such as polymethyl methacrylate (PMMA). The metal hard-mask side of the template can be bonded to the resist layer on the light emitting surface using a variety of techniques, including without limitation resist bonding.

After bonding to the surface, the template can be separated from the metal hard-mask and removed using known techniques. A template such as AAO in the presence or absence of a sacrificial layer can be removed using appropriate wet etch technologies, including without limitation processes using either basic or acidic solutions. Non-limiting examples of suitable bases or acids for wet etch solutions include potassium hydroxide (KOH) and nitric acid ($HNO_3$) or hydrofluoric acid (HF), respectively. A template having a sacrificial layer such as $SiO_2$ can be removed using a solution of buffered HF, for example, which etches the sacrificial layer and thus separates the template from the metal layer. Alternatively, in embodiments containing a mold release layer, the template can be physically separated at the mold release layer/template interface using a number of techniques, including without limitation the aid of a shearing force from a thin metal blade. Such template-release layers may be beneficial in situations where the extended time periods required for wet etch processes result in metal defects such as peeling.

Once the template is removed, dry etching the light emitting surface can be achieved using a reactive ion etch (RIE) process and, more particularly, an inductively coupled plasma reactive ion etch (ICP-RIE) process. This process can create high aspect ratio surface features on a microscopic (submicron) scale in the light emitting surface. An oxygen-based plasma etch process can, for example, be used to remove the binder, followed by a chlorine-based plasma process to etch the light emitting surface. The metal hard-mask is typically sputtered away by the end of the second dry etch step. If any metal residue remains after dry etch processing, it can be readily removed by a subsequent wet etch process such as, for example, a wet etch using buffered HF. The dry etch process is typically applied for a time period ranging from about 15 minutes to about 180 minutes.

In embodiments having an optional dielectric layer on the light emitting surface, a separate etch step may be required to transfer the metal hard-mask pattern into the dielectric layer prior to dry etching the light emitting surface. One non-limiting example of such a step is fluorine-based plasma etch process. The dielectric layer can be at least partially removed during the subsequent dry etch processing of the light emitting layer, and any residue remaining can then be removed by a subsequent etch process such as, for example, a wet etch using buffered HF.

Figure 2A:
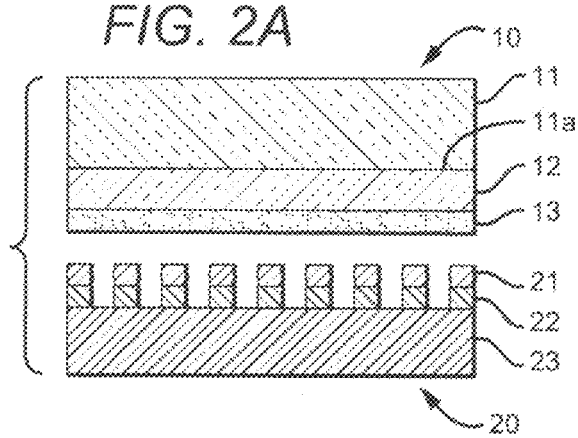
FIG. 2A is a schematic cross sectional view of one embodiment of the a surface of a semiconductor light emitter and a template containing a mask according to the present invention.
Figure 2B:
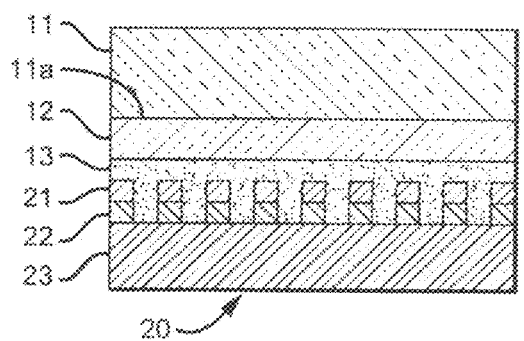
FIG. 2B is a schematic cross sectional view of the embodiment shown in FIG. 2A after bonding the surface to the mask.

FIGS. 2A-2E are schematic diagrams showing one embodiment of semiconductor device during the process described above and shown in FIG. 1. The semiconductor device (10) shown in FIG. 2A comprises a layer (11) having a surface (11a) for submicron roughness. The device (10) is preferably an LED and the layer (11) is preferably part of an LED and the surface (11a) is preferably a light emitting surface. The light emitting surface (11a) can be covered by a layers of dielectric material (12) and binder material (13), respectively. The pre-bonded template (20) in FIG. 2A contains a metal layer (21), a sacrificial layer (22) and porous template material (23) as described above. FIG. 2B shows the template-surface structure in this embodiment after bonding the metal hard-mask (21) on the pre-bonded template (20) to the binder material (13) on the light emitting surface (10).

Figure 2C:
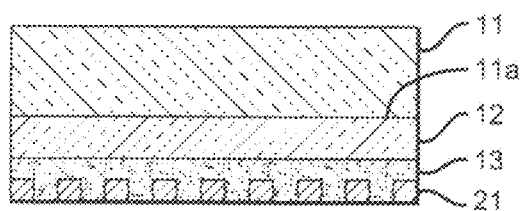
FIG. 2C is a schematic cross sectional view of the embodiment shown in FIG. 2B after removal of a template and sacrificial layer.
Figure 2D:
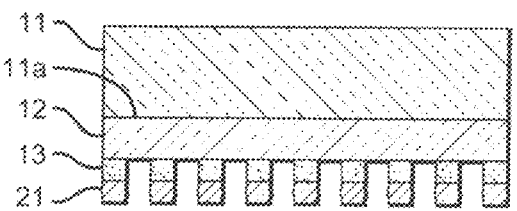
FIG. 2D is a schematic cross sectional view of the embodiment shown in FIG. 2C during dry etch processing.
Figure 2E:
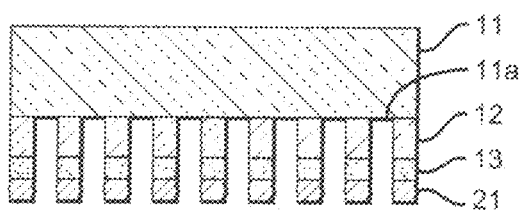
FIG. 2E is a schematic cross sectional view of the embodiment shown in FIG. 2D during dry etch processing of a dielectric layer.

FIG. 2C is a schematic diagram showing the configuration in FIG. 2B after removal of the sacrificial layer (22) and template (23). The submicron roughness on the light emitting surface is then formed by dry etching through the thin film metal hard-mask (21). In this embodiment, a first dry etch step can be performed to pattern or partially remove the binder material (13) as shown in FIG. 2D. A second etch step may then be used partially or completely transfer the metal hard-mask pattern to the dielectric layer (12), as shown in FIG. 2E. In embodiments not having the dielectric layer this process step is not performed. Further dry etch processing can remove the metal hard-mask (21), binder layer (13) and dielectric layer (12), and results in a light emitting layer (11) having a surface (11a) with a high aspect ratio submicron roughness which is shown schematically in FIG. 2F as projections (30) on the surface (11a).

Figure 2F:
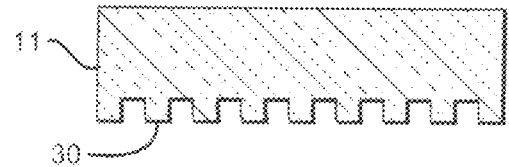
FIG. 2F is a schematic cross sectional view of the embodiment shown in FIG. 2E after dry etch processing of the light emitter's surface.

For simplicity, the projections shown in FIG. 2F are portrayed as being symmetric in nature, but in reality the roughened surface provides non-symmetric projections, irregular, or multifaceted projections. After cleaning up any residual metal, dielectric, or binder material on the surface as needed, regular LED processing can continue.

EXAMPLES

Example 1

Preparation of a Metal Hard-Mask

A 2 cm×2 cm Anopore™ AAO membrane (Whatman Inc., Florham Park, N.J.) template having a nominal pore size of 0.1 μM was prepared by mechanical polishing. A 30 nm (300

Å) gold on aluminum ("Au/Al") metal bilayer was deposited on the polished surface of the template by electron beam evaporation or sputtering. The average pitch size of the resulting AAO-Au template was 200 nm and the average diameter of the pores was 100 nm.

FIG. 3 is a scanning electron microscope (SEM) image of an AAO template prepared according Example 1. The inherent submicron structure of this material is clearly visible using the imprinted scale in the image. The average diameter of the pores in the template is about 100 nm. The thickness of the metal layer is about 30 nm (300 Å). The surface of the template prior to metal deposition is essentially identical. The SEM image shown in FIG. 3 was obtained on a FEI Sirion SEM tool under an acceleration voltage of 5 kV.

Example 2

Preparation of a LED Light Emitting Back Surface with High Aspect Ratio Submicron Roughness A 2 nm thick layer of GaN-based LED structure was grown on a SiC substrate wafer (CREE, Inc., Durham, N.C.) by metalorganic chemical vapor deposition (MOCVD). After the exposed p-type GaN surface (top surface) was bonded to a SiC carrier wafer through a metal-based bonding process, the SiC substrate was removed by mechanical grinding or plasma etching. A 200 nm thick layer of binder material (PMMA) was then deposited onto the n-type GaN.

An AAO-Au template prepared according to Example 1 was then placed on top of the layer of binder material, metal side down, using a uniformly applied pressure and bonded to the GaN layer by heating at 160° C. in a Nanonex NX-2000 tool for about 2 minutes. The AAO template was subsequently removed through a wet chemical etch process using either a base (e.g. KOH) solution or an acid (e.g. $HNO_3$) solution. An oxygen-based plasma etch process was then used to remove the binder and the final GaN etch step achieved using a chlorine-based plasma. A wet etch step (e.g. using aqua-regia) can be used after the GaN etch to clean up residual Au particles.

FIG. 4 is a SEM image taken from a GaN surface, modified according to the method described in Example 2, showing the roughness and deep etch depth (approximately 1 μm) achieved using RIE in the presence of a metal hard-mask formed on the AAO template shown in FIG. 3. The aspect ratio of the etched projections on the surface is about 5 and their dimensions are irregular, non-symmetrical, and multi-faceted. The SEM image in FIG. 4 was obtained using, a FEI Sirion SEM tool with 5 kV electron acceleration voltage and 25000× magnification.

The embodiments and examples set forth herein were presented to explain the nature of the present invention and its practical application, and thereby to enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims. For example, while the use of GaN LED chips is described herein, the invention contemplated is not so limited. One skilled in the art will recognize that the invention may potentially be applied to all types of LED chips.

I claim:

1. A light emitting diode, comprising:
   a plurality of semiconductor layers at least one of which has a light emitting surface;
   at least a portion of said light emitting surface having a high aspect ratio submicron roughness to enhance light extraction, such that the submicron roughness comprises structures with submicron height and width.

2. The light emitting diode of claim 1, wherein at least a portion of said submicron roughness comprises non-symmetrical surface structures on said light emitting surface.

3. The light emitting diode of claim 1, wherein at least some of the submicron roughness comprises multifaceted projections on said light emitting surface.

4. The light emitting diode of claim 1, wherein at least a portion of the submicron roughness comprises submicron projections comprising edges.

5. The light emitting diode of claim 1, wherein at least a portion of the submicron roughness comprises submicron projections comprising angles.

6. The light emitting diode of claim 1, wherein at least a portion of the submicron roughness comprises projections with an etch depth of approximately 500 nm.

7. The light emitting diode of claim 1, wherein at least a portion of the submicron roughness comprises projections with an etch depth of 1000 nm or less.

8. The light emitting diode of claim 1, wherein at least a portion of said submicron roughness comprises submicron projections with an average diameter of least about 100 nm.

9. The light emitting diode of claim 1, wherein at least a portion of said submicron roughness comprises submicron projections with an average diameter of up to about 200 nm.

10. The light emitting diode of claim 1, wherein a least a portion of said submicron roughness comprises submicron projections with an aspect ratio up to about 10.

11. The light emitting diode of claim 1, wherein a least a portion of said submicron roughness comprises submicron projections with an aspect ratio of approximately 5.

12. The light emitting diode of claim 1, wherein said submicron roughness is formed by an etch process.

13. The light emitting diode of claim 1, wherein said submicron roughness is formed by a dry etch process.

14. The light emitting diode of claim 1, wherein said submicron roughness is formed by a reactive ion etch (RIE) process.

15. A semiconductor device, comprising:
   a plurality of semiconductor layers at least one of which has an exposed surface;
   at least a portion of said exposed surface having a high aspect ratio submicron roughness, such that the submicron roughness comprises structures with submicron height and width.

* * * * *